United States Patent
Den Braber

[11] Patent Number: 5,966,400
[45] Date of Patent: Oct. 12, 1999

[54] RECEIVER

[75] Inventor: Gerard P. Den Braber, Eindhoven, Netherlands

[73] Assignee: U.S. Philips Corporation, New York, N.Y.

[21] Appl. No.: 08/272,435

[22] Filed: Jul. 8, 1994

Related U.S. Application Data

[63] Continuation of application No. 07/909,240, Jul. 6, 1992, abandoned.

[30] Foreign Application Priority Data

Jul. 15, 1991 [EP] European Pat. Off. .............. 91201847

[51] Int. Cl.⁶ ............................. H03K 9/00; H04L 27/06; H04L 27/14
[52] U.S. Cl. ............................. 375/75; 375/81; 329/319; 329/360; 329/325; 455/260
[58] Field of Search .................................. 375/81, 77, 76, 375/75, 78; 381/13; 455/260; 329/315, 319, 360, 356, 325, 347; 370/110.2

[56] References Cited

U.S. PATENT DOCUMENTS

| | | |
|---|---|---|
| 4,607,393 | 8/1986 | Nolde et al. .............................. 455/208 |
| 4,631,499 | 12/1986 | Kasperkovitz .......................... 455/260 |
| 5,001,757 | 3/1991 | Field et al. ................................ 381/13 |
| 5,093,930 | 3/1992 | Kasperkovitz .......................... 455/260 |

*Primary Examiner*—Stephen Chin
*Assistant Examiner*—Tesfaldet Bocure
*Attorney, Agent, or Firm*—Edward W. Goodman

[57] ABSTRACT

Receiver having an RF input for applying an RF input carrier-modulated modulation signal thereto, which receiver is coupled to a multiplier circuit and to a phase-locked loop (PLL) with a signal path incorporating a phase detector, a loop filter, a first dc decoupling circuit and a controlled oscillator having an in-phase and a quadrature output via which local in-phase and quadrature carriers are applied to the multiplier circuit and the phase detector, respectively, and a signal generator for generating a local auxiliary pilot and a pilot detector for detecting the local auxiliary pilot, an output of which is coupled to the controlled oscillator via a low-pass filter. In order to reduce the influence of oscillator radiation and other parasitic crosstalk effects on the dc reduction, an output of the signal generator is coupled to the signal path of the phase-locked loop between an output of the phase detector and a control input of the controlled oscillator, an output of the multiplier circuit is coupled to a first input and the output of the signal generator is coupled to a second input of the pilot detector.

27 Claims, 1 Drawing Sheet

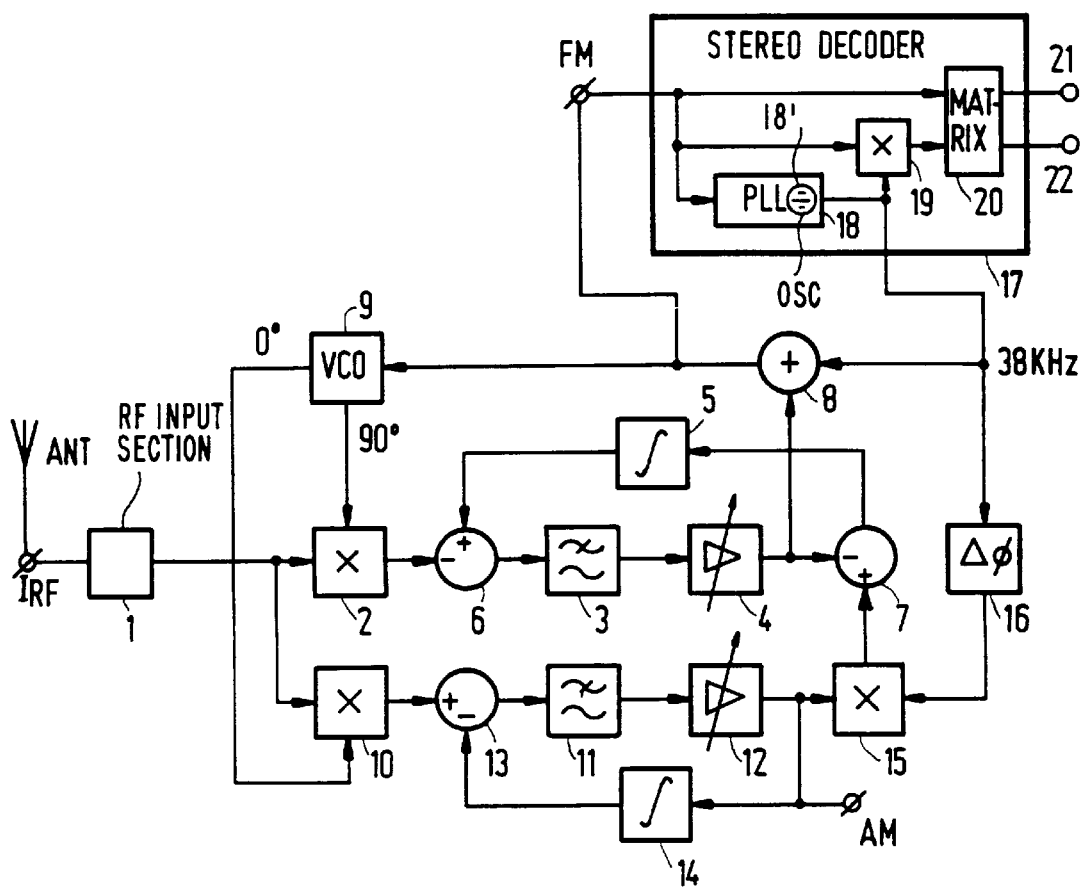

RECEIVER

This is a continuation of application Serial No. 07/909, 240, filed on Jul. 6, 1992 abandoned.

BACKGROUND OF THE INVENTION

1. Field of the Invention

The invention relates to a receiver having an RF input section for receiving for applying an RF input carrier-modulated modulation signal. The RF input section is coupled to a multiplier circuit and to a phase-locked loop (PLL) with a signal path incorporating a phase detector, a loop filter, a first dc decoupling circuit and a controlled oscillator having an in-phase and a quadrature output via which local in-phase and quadrature carriers are applied to the multiplier circuit and the phase detector, respectively, and a signal generator for generating a local auxiliary pilot and a pilot detector for detecting the local auxiliary pilot, an output of which is coupled to the controlled oscillator via a low-pass filter.

2. Description of the Related Art

A receiver of this type is known per se, for example from European Patent Specification no. 184873 (corresponding to U.S. Pat. No. 4,631,499).

The known receiver is a directly mixing AM PLL synchronous receiver whose multiplier circuit is used for synchronous detection of a modulation signal which is amplitude-modulated on the RF input carrier. The local mixing carrier required for the synchronous detection is obtained by means of the controlled oscillator incorporated in the phase-locked loop and should be phase-synchronous with the RF input carrier for a correct synchronous detection. The local mixing carrier is therefore also referred to as local in-phase carrier.

As is known, the loop signal, i.e. the signal in the phase-locked loop, undergoes an unwanted dc offset which is substantially caused by circuit and/or bias voltage asymmetries and cannot be completely avoided in practice. To prevent this unwanted dc offset from disturbing a correct phase control of the controlled oscillator, particularly at comparatively small amplitudes of the RF input carrier, said RF input carrier and the local quadrature carrier of the controlled oscillator modulated in amplitude by means of the auxiliary pilot are applied to the phase detector of the known directly mixing AM synchronous receiver. Consequently, the phase detector supplies a desired mixing product at a frequency which is equal to the auxiliary pilot frequency and which varies in amplitude with the phase difference deviating from 90° between the RF input carrier and the local quadrature carrier. DC components are removed from this desired mixing product in said first dc decoupling circuit and subsequently applied to the pilot detector for synchronous amplitude detection. A dc signal whose amplitude varies with the last-mentioned phase difference is obtained at the output of the pilot detector. This dc phase difference signal is applied as an oscillator control signal to the controlled oscillator. Due to the dc offset suppression in the first dc decoupling circuit, this oscillator control circuit and hence the phase lock between the local carriers and the RF input carrier is comparatively insensitive to said unwanted dc offsets.

However, due to oscillator radiation and other effects of parasitic crosstalk, the unmodulated oscillator signal occurs with a crosstalk-dependent amplitude at the RF input of the receiver. This parasitic oscillator signal is multiplied in the phase detector by the oscillator signal which is amplitude-modulated by means of the auxiliary pilot, which results in an unwanted mixing product at a frequency which is the same as that of the auxiliary pilot. This unwanted mixing product is inseparably superimposed on said desired mixing product and disturbs the phase difference information in the desired mixing product. Both mixing products jointly pass the first dc decoupling circuit, with the unwanted mixing product at the output of the pilot detector resulting in a parasitic dc offset disturbing the desired dc phase difference signal. Since this parasitic dc offset increases with the frequency of the oscillator signal, a phase error, increasing with the frequency, between the local carrier and the RF input carrier occurs in the known directly AM synchronous receiver.

The dc offset reduction mode used in the known AM PLL synchronous receiver is therefore unsuitable for use in receivers for the reception of signals which are modulated on a much higher carrier frequency than that of the conventional RF AM radio signals which are of the order of at most 1 MHz. Examples are FM PLL synchronous receivers for receiving the now conventional FM radio signals at an RF carrier of the order of 100 MHz, and FM receivers including a PLL FM demodulator tuned to a comparatively high intermediate frequency such as, for example TV satellite receivers.

Moreover, the 3 dB loop passbandwidth of the phase-locked loop of the known AM PLL synchronous receiver is considerably smaller than that of FM receivers and therefore presents fewer problems as regards noise behavior, stability and selectivity.

SUMMARY OF THE INVENTION

It is an object of the invention to realize an effective, frequency-independent reduction of unwanted parasitic dc offsets in the control signal of the controlled oscillator by means of a local auxiliary pilot in a receiver including a phase-locked loop for generating and phase locking a local carrier with a frequency-modulated or unmodulated RF input carrier.

According to the invention, a receiver of the type described in the opening paragraph is therefore characterized in that an output of the signal generator is coupled to the signal path of the phase-locked loop between an output of the phase detector and a control input of the controlled oscillator, an output of the multiplier circuit is coupled to a first input and the output of the signal generator is coupled to a second input of the pilot detector.

The invention is based on the recognition that a phase or frequency modulation of the controlled oscillator by means of the auxiliary pilot provides the possibility of obtaining the desired phase difference signal and processing it outside the phase-locked loop, i.e. completely separated from the ac components of the signal in the loop, which is the baseband modulation signal in the case of an FM receiver. On the other hand, such an angle modulation of the controlled oscillator with the auxiliary pilot prevents an unmodulated parasitic oscillator signal from occurring at the RF input due to oscillator radiation and/or other parasitic crosstalk effects. Since the local in-phase and quadrature carriers supplied by the controlled oscillator are angle-modulated with the auxiliary pilot, the parasitic oscillator signals at the RF input are also angle-modulated with the auxiliary pilot. These parasitic angle-modulated oscillator signals give rise to a parasitic dc offset at the output of the phase detector. Since, as already noted hereinbefore, the phase difference signal is generated and processed outside the loop, it is possible to effectively eliminate this parasitic dc offset by means of said first dc decoupling circuit while maintaining an adequate phase control operation of the phase-locked loop.

When the measure according to the invention is used, the auxiliary pilot is injected in the signal path of the phase-locked loop between an output of the phase detector and the control input of the controlled oscillator. As a result, the controlled oscillator only supplies local in-phase and quadrature carriers which are angle-modulated, i.e. frequency or phase-modulated with the auxiliary pilot. By multiplying the local angle-modulated in-phase carrier by the RF input carrier in said multiplier circuit, a desired mixing product is obtained at the frequency of the auxiliary pilot whose amplitude varies with the phase difference between these two last-mentioned carriers.

In the phase-locked loop, a dc decoupling is effected in the signal path between the phase detector and the controlled oscillator, so that parasitic dc offsets due to oscillator radiation are prevented.

Due to the dc decoupling only a negative feedback of the ac components in the output signal of the phase detector takes place in the phase-locked loop within the passband of the phase-locked loop and a slowly varying, or static dc phase control of the controlled oscillator from the phase detector is prevented. In accordance with the aforementioned recognition on which the invention is based, use is made of said desired mixing product for this static phase control, which product is available at the output of the multiplier circuit. By synchronous amplitude detection of this desired mixing product with the auxiliary pilot or a synchronous mixing carrier derived therefrom, a conversion of this desired mixing product in a dc phase difference signal is obtained in accordance with the invention, which signal is applied as an oscillator control signal to the controlled oscillator after a low-pass selection. Unwanted, parasitic dc offsets of the desired mixing product at the output of the multiplier circuit are modulated on the auxiliary pilot frequency in the pilot detector and subsequently suppressed in the low-pass filter.

Such a receiver according to the invention is preferably characterized in that a phase-shifting circuit is incorporated in one of the two signal paths between the output of the multiplier circuit and the first input of the pilot detector and between the output of the signal generator and the second input of the pilot detector.

When this measure is used, it is possible to further optimize the phase control.

A further preferred embodiment is characterized in that the output of the multiplier circuit is connected to the first input of the pilot detector via a second dc decoupling circuit.

When this measure is used, the dc offset reduction according to the invention can be further improved.

A preferred embodiment of an FM receiver according to the invention is characterized by a stereo decoding circuit for decoding a baseband stereo multiplex signal incorporating a baseband stereo sum signal, a 19 kHz stereo pilot and a stereo difference signal in left and right stereo signals double sideband amplitude-modulated on a suppressed 38 kHz subcarrier, said stereo decoding circuit comprising a further phase-locked loop for phase locking with the 19 kHz stereo pilot, which further phase-locked loop forms part of said signal generator.

In this preferred embodiment, the controlled oscillator incorporated in the further phase-locked loop is also used as a signal generator for the auxiliary pilot.

BRIEF DESCRIPTION OF THE DRAWING

The invention will be described in greater detail with reference to the sole FIGURE shown in the drawing which only serves to illustrate the invention.

DESCRIPTION OF THE PREFERRED EMBODIMENT

The FIGURE shows an FM and/or AM PLL synchronous receiver according to the invention, comprising a radio frequency (RF) antenna input $I_{RF}$ for coupling an antenna device ANT thereto, and an RF input section 1 coupled to the RF antenna input $I_{RF}$, a phase-locked loop 2-16 and an oscillator operating as a signal generator 18' for generating a local auxiliary pilot. In the case of an FM mono and/or an AM PLL synchronous receiver, the signal generator 18' may be realized by means of a (crystal) oscillator having a suitably chosen fixed frequency (not shown). In the case of an AM PLL synchronous receiver, the loop 2-16 has an AM baseband signal output AM at which an AM baseband modulation signal becomes available for further processing and reproduction in a baseband signal processing device (not shown).

In the case of an FM PLL synchronous receiver, the phase-locked loop 2-16 has an FM baseband signal output FM at which an FM baseband modulation signal becomes available.

In the case of an FM PLL stereo synchronous receiver, as shown, the FM baseband signal output FM is coupled to a stereo decoder 17. When an RF FM stereo signal is received, the FM baseband modulation signal comprises a stereo multiplex signal which has a stereo sum signal in a frequency range between 0 and 15 kHz, a 19 kHz stereo pilot and a stereo difference signal (L-R) double sideband amplitude-modulated on a suppressed 38 kHz stereo subcarrier in a frequency range between 23 and 53 kHz.

The stereo decoder 17 includes a phase-locked loop 18 which comprises a controlled oscillator for regenerating said 38 kHz stereo subcarrier. By using this 38 kHz stereo subcarrier or a carrier derived therefrom as a local auxiliary pilot, this controlled oscillator also functions as said signal generator 18'. The stereo decoder also includes a synchronous stereo difference signal demodulator 19 and a dematrixing circuit 20 with left and right stereo signal outputs 21 and 22. Such a stereo decoder is known per se and may be of the type TEA 5581. The 38 kHz stereo subcarrier is regenerated in known manner by phase synchronization of the controlled oscillator 18' incorporated in the phase-locked loop 18. The regenerated 38 kHz stereo subcarrier and said modulated stereo difference signal (L-R) are applied to first and second inputs of the synchronous stereo difference signal demodulator 19. A synchronous amplitude detection of the stereo difference signal (L-R) is effected in the stereo difference signal demodulator 19. Together with the stereo sum signal (L+R) of said stereo multiplex signal, the baseband stereo difference signal (L-R) thus obtained is applied to the dematrixing circuit 20. In the dematrixing circuit 20 the left and right stereo signals are obtained in known manner by suitably chosen linear combinations of the stereo sum and stereo difference signals (L+R) and (L-R). These signals become available at the left and right stereo signal outputs 21 and 22, respectively, for further processing and reproduction.

In contrast to conventional phase-locked loops, the phase-locked loop 2-16 of FIG. 1 has a separation between the dynamic and static phase control. The dynamic phase control is understood to mean the frequency and/or phase control of the controlled oscillator 9 due to comparatively rapid variations in frequency and/or phase of the RF input carrier, for example, when the RF input carrier is frequency or phase-modulated with a modulation signal. Static phase control is understood to mean the frequency and/or phase control of the controlled oscillator 9 due to comparatively slow variations in the frequency and/or phase difference between the RF input carrier, on the one hand, and the in-phase local mixing carrier, on the other hand, which takes place, for example, after the controlled oscillator 9 is tuned to a frequency which differs from the frequency of the RF carrier of a desired reception signal over at most a frequency range which is equal to the capture range of the phase-locked loop.

To this end, the phase-locked loop 2-16 has a dynamic control loop 2-9 and a static control loop 3-16. The dynamic control loop 2-9 incorporates a phase detector 2, a first input of which is connected to an output of the RF input section 1 and an output of which is successively coupled to a first loop filter 3, a first subtracter stage 6 of a dc decoupling circuit 5-7, a first amplifier 4, an adder circuit 8 and a controlled oscillator 9. The controlled 9 oscillator supplies local in-phase and quadrature mixing carriers which mutually differ 90° in phase. The local quadrature mixing carrier is applied to a second input of the phase detector 2.

An effective dc decoupling of the output signal of the phase detector 2 is obtained by means of the first dc decoupling circuit 5-7. To this end, this first dc decoupling circuit 5-7 comprises a selective dc negative feedback path incorporating a first integrator 5. The inverted output signal of the first amplifier 4 is applied to an input of this first integrator 5. The signal inversion required for this purpose is effected via a subtracter stage 7, an inverting input of which is coupled to the output of the first amplifier 4 and an output is coupled to the input of the first integrator 5. The selective dc negative feedback path selects the dc component from the inverted and amplified loop signal and applies it to the output signal of the phase detector 2 so that a dc suppression takes place therein. To this end, in the embodiment shown, an output of the first integrator 5 is connected to a non-inverting input of the subtracter stage 6. The subtracter stage 6 also has an inverting input and an output which are coupled to the output of the phase detector 2 and to an input of the loop filter 3, respectively. In this embodiment the loop filter 3 and the amplifier 4 contribute to the dc suppression.

In general, a dc suppression can be realized by coupling out the dc component in the output signal of the phase detector 2 and by negatively feeding it back at a suitable amplitude to an arbitrary point in the signal path between this phase detector 2 and the controlled oscillator 9. In principle, the exact location of the coupling-out point of the dc component as well as that of the return point is irrelevant in this part of the loop signal path.

It is alternatively possible (not shown) to apply the output signal of the first amplifier 4 without signal inversion to the input of the first integrator 5 and to connect the output of this first integrator to the inverting input of the subtracter stage 6.

The output of the phase detector is then to be connected to the non-inverting input of the subtracter stage 6. It is also feasible to realize a dc decoupling by means of a series capacitance at the output of the phase detector 2 (not shown).

After dc suppression in the subtracter stage 6 of the first dc decoupling circuit 5-7, selection in the first loop filter 3 and amplification in the first amplifier 4, the output signal of the phase detector 2 is applied to a control input of the controllable oscillator 9 as well as to the FM baseband signal output FM. As a result of said dc decoupling, the oscillator control signal applied from the phase detector 2 and the dc decoupling circuit to the controlled oscillator 9 does not comprise a dc component but only ac components. In the phase-locked state, phase differences deviating from 90° between the local quadrature mixing carrier and the RF input carrier are strongly fed back negatively and thus suppressed in the dynamic control loop 2-9. As a result the last-mentioned oscillator control signal varies accurately with the baseband frequency modulation signal of the RF input carrier, and the local in-phase and quadrature mixing carriers generated by the controlled oscillator 9 accurately follow the frequency modulation of the RF reception carrier. In the phase-locked state, the dynamic control loop therefore functions as a frequency demodulator. As already noted, this baseband frequency modulation signal is applied to the FM baseband signal output FM. *Mutatis mutandis* the same applies to a phase-modulated RF input carrier. The local quadrature mixing carrier is applied to a second input of the phase detector 2.

The stereo subcarrier is injected as a local auxiliary pilot in the signal path of the dynamic control loop 2-9 via the adder circuit 8 from the oscillator 18', operating as a signal generator, of the stereo decoder 17. Consequently, the local mixing carriers are frequency or phase-modulated with this local auxiliary pilot. Due to oscillator radiation and other crosstalk phenomena, parasitic oscillator signals may occur at the RF input of the phase detector 2. However, these parasitic oscillator signals are frequency or phase-modulated with the local auxiliary pilot in the same manner as said original local mixing carriers. These parasitic oscillator signals give rise to an unwanted dc product which is effectively eliminated as a result of the dc suppression in the first dc suppression circuit 5-7.

The static control loop 3-16 comprises a multiplier circuit 10, a first input of which is connected to the output of the RF input section 1 and an output of which is coupled to a second loop filter 11, a second amplifier 12, a second dc decoupling circuit 13, 14 and a pilot detector 15. The local in-phase mixing carrier is applied from the controlled oscillator 9 to a second input of the multiplier circuit 10. The stereo subcarrier is applied as a local synchronous auxiliary mixing signal to the pilot detector 15 from the controlled oscillator 18', operating as a signal generator, of the stereo decoder 17 via a phase-shifting circuit 16. The static control loop 3-16 has the circuits 3-9 in common with the dynamic control loop 2-9. The output signal of the multiplier circuit 10 is applied to the pilot detector 15 as well as the AM baseband signal output AM after selection in the second loop filter 11, amplification in the second amplifier 12 and dc suppression in the second dc decoupling circuit 13, 14. The remarks made hereinbefore with reference to the dc suppression modes in the dynamic control loop 2-9 also apply mutatis mutandis for the dc suppression in this static control loop 3-16.

An RF FM frequency reception range received via the antenna device ANT is applied to the first inputs of the phase detector 2 of the dynamic control loop 2-9 as well as to the multiplier circuit 10 of the static control 3-16, after wideband selection and amplification in the RF reception section 1. The control input of the controlled oscillator 9 may receive, inter alia, a tuning control signal with which the frequency of said local carriers can be tuned to the RF reception carrier of a desired signal in said RF FM reception range.

Due to the dc decoupling in the signal path between the output of the phase detector 2 and the control input of the controlled oscillator 9, only a dynamic phase control of the controlled oscillator 9 takes place from the phase detector 2 and a static phase control of the controlled oscillator 9 from the phase detector 2 is prevented.

For deriving the dc phase control signal, use is made, according to the invention, of the local auxiliary pilot supplied by the signal generator 18', i.e. the controlled oscillator, operating as a signal generator, of the stereo decoder 17. This local auxiliary pilot is applied to the control input of the controlled oscillator 9 via the adder circuit 8 and frequency-modulates the local mixing carriers of this controlled oscillator 9. In the multiplier circuit 10, the local in-phase mixing carrier frequency-modulated with the pilot signal (hereinafter also to be understood to be phase-modulated) is multiplied by the RF reception carrier. The mixing product then obtained has a dynamic component or a dynamic phase error which varies in dependence upon the frequency modulation signal, and a static phase error which can be considered to be a varying dc component and which varies with the average phase difference between the RF reception carrier and the local in-phase mixing carrier. It can be shown that the transfer of a dynamic phase error or a dynamic phase difference between the RF reception carrier and the local mixing carrier of the controlled oscillator 9 at the first and second inputs of the multiplier circuit 10 to an ac signal at the output of the multiplier circuit 10 is dependent on the static phase error or the static phase difference between the RF reception carrier at the first and second inputs of the multiplier circuit 10 and the local in-phase mixing carrier of the controlled oscillator 9. In a formula:

$$U_q = K * \cos(\overline{\phi_i - \phi_o} + \tilde{\phi}_i - \tilde{\phi}_o)$$
$$= K * \cos(\overline{\phi_i - \phi_o}) * \cos(\tilde{\phi}_i - \tilde{\phi}_o) -$$
$$K * \sin(\overline{\phi_i - \phi_o}) * \sin(\tilde{\phi}_i - \tilde{\phi}_o)$$

The transfer function is divided into an even and an odd part. In the case of a sinusoidal dynamic phase error, the odd part supplies the odd harmonics (including the fundamental harmonic), and the even part supplies the even harmonics.

Injection in the phase-locked loop of a local auxiliary pilot at the frequency $\mu_p$ causes an (additional) dynamic phase error $\Phi_i - \Phi_o = \sin \mu_p t$. Dependent on the coefficient of the odd part of the transfer function for dynamic phase errors, the amplitude and polarity of the auxiliary pilot at the output of the multiplier circuit 10 are:

$K \sin (\Phi_i - \Phi_o)$.

The latter is equal to the dc phase difference signal at the output of the phase detector 2. By detecting amplitude and polarity of the auxiliary pilot in the output signal of the multiplier circuit 10, the desired dc phase difference signal can thus be reconstructed. This is effected by means of synchronous amplitude detection in the pilot detector 15.

From the signal generator 18', the controlled oscillator functioning as a signal generator in the stereo decoder 17, the local auxiliary pilot is therefore applied as a local mixing subcarrier to the pilot detector 15 after a suitably chosen phase shift in the phase-shifting circuit 16. In the embodiment shown, the dc phase difference signal thus obtained at the output of the pilot detector 15 is applied to the non-inverting input of the subtracter stage 7 and is applied to the control input of the controlled oscillator 9 via the adder circuit 8 after selection in the first integrator 5 and the first loop filter 3 and amplification in the first amplifier 4. Consequently, the static control loop 3-16 realizes a frequency and phase control which is substantially operative while the loop is capturing.

It will be evident that the subtracting operation in the subtracter stage 7 should be reversed when reversing the subtracting operation in the subtracter stage 6 in which the phase detector 2 is connected to the non-inverting input and the first integrator 5 is connected to the inverting input of the subtracter stage 6. In that case, which is not shown, the output of the pilot detector 15 is thus to be coupled to the inverting input and the first amplifier 4 is to be coupled to the non-inverting input of the subtracter stage 7.

A further improvement of the dc compensation is obtained by realizing a dc decoupling between the multiplier circuit 10 and the synchronous pilot detector 15. This can be realized in different manners in analogy with the methods described hereinbefore with reference to dc decoupling in the dynamic control loop 2-9. The embodiment shown is preferably employed, using the second dc decoupling circuit 13, 14. This second dc decoupling circuit 13, 14 has a subtracter stage 13 with inverting and non-inverting inputs, whose non-inverting input is coupled to the output of the multiplier circuit 10 and an output of which is coupled to an input of a low-pass filter operating as a second loop filter 11, and a second selective dc negative feedback path which is provided with a second integrator 14, an input of which is coupled to an output of the second amplifier 12 and an output is coupled to the inverting input of the subtracter stage 13.

In the phase-locked state of the static control loop 3-16, the multiplier circuit 10 also operates as a synchronous amplitude detector. When an RF AM signal is received, the baseband AM modulation signal is obtained at the output of this multiplier circuit 10. This signal is preferably coupled out, after selection in the second loop filter 11 and amplification in the second amplifier 12, via the AM baseband modulation signal output AM.

It will be evident that alternative embodiments are feasible. For example, the phase-shifting circuit 16 as well as the amplifiers 4 and 12 may be dispensed with and a different mode of dc suppression and combination of the control signals of the dynamic and static control loops may be chosen. It is also possible to use the phase-locked loop shown in an FM superheterodyne receiver whose RF input section 1 not only realizes a wideband selection and amplification of the RF FM reception range, but also an up conversion of this RF FM reception range to a frequency above the highest frequency of said FM RF reception range.

I claim:

1. A receiver having an RF input section for receiving an RF input carrier-modulated modulation signal; a multiplier circuit and a phase-locked loop (PLL) coupled to an output of said RF input section for supplying a baseband signal, said phase-locked loop having a PLL signal path incorporating a phase detector, a loop filter coupled to an output of said phase detector, a first dc decoupling circuit coupling an output of said loop filter to an input of said loop filter, and a controlled oscillator having a control input coupled to the first dc decoupling circuit, said oscillator having an in-phase output and a quadrature output coupled, respectively, to said multiplier circuit and said phase detector via which local in-phase and quadrature carriers are respectively applied; a signal generator for generating a local auxiliary pilot; and a pilot detector for detecting the local auxiliary pilot, an output of said pilot detector (PD) being coupled to the control input of the controlled oscillator via a PD signal path including said first dc decoupling circuit and said loop filter, which is a low-pass filter, characterized in that an output of the signal generator is also coupled to said control input of the controlled oscillator, an output of the multiplier circuit is coupled to a first input of the pilot detector, and the output of the signal generator is also coupled to a second input of the pilot detector.

2. A receiver as claimed in claim 1, characterized in that a phase-shifting circuit is incorporated in a signal path between the output of the signal generator and the second input of the pilot detector.

3. A receiver as claimed in claim 2, characterized in that the first dc decoupling circuit comprises a first amplifier circuit having an input coupled to the output of the loop filter and an output coupled to the control input of the controlled oscillator, the output of said amplifier circuit also being negatively fed back along with the output of the pilot detector, via a first selective dc negative feedback path, to the signal path between the output of the phase detector and the input of the loop filter.

4. A receiver as claimed in claim 3, characterized in that the first selective dc negative feedback path comprises a first integrator and a differential stage having an inverting input, a non-inverting input and an output, said inverting and non-inverting being coupled to, respectively, said outputs of the first amplifier circuit and the pilot detector, and the output of the differential stage being coupled to an input of the first integrator.

5. A receiver as claimed in claim 4, characterized in that the output of the multiplier circuit is coupled to the first input of the pilot detector via a second dc coupling circuit.

6. A receiver as claimed in claim 5, characterized in that the second dc decoupling circuit comprises a second low-pass filter having an input coupled to the output of said multiplier circuit, and a second amplifier circuit coupled to an output of said second low-pass filter, an output of said second amplifier circuit being coupled to the first input of the pilot detector, the output of said second amplifier circuit also being negatively fed back via a second selective dc negative feedback path to the signal path between the output of the multiplier circuit and the input of the second low-pass filter.

7. A receiver as claimed in claim 3, characterized in that the output of the multiplier circuit is coupled to the first input of the pilot detector via a second dc coupling circuit.

8. A receiver as claimed in claim 7, characterized in that the second dc decoupling circuit comprises a second low-pass filter having an input coupled to the output of said multiplier circuit, and a second amplifier circuit coupled to an output of said second low-pass filter, an output of said second amplifier circuit being coupled to the first input of the pilot detector, the output of said second amplifier circuit also being negatively fed back via a second selective dc negative feedback path to the signal path between the output of the multiplier circuit and the input of the second low-pass filter.

9. A receiver as claimed in claim 2, characterized in that the output of the multiplier circuit is coupled to the first input of the pilot detector via a second dc coupling circuit.

10. A receiver as claimed in claim 9, characterized in that the second dc decoupling circuit comprises a second low-pass filter having an input coupled to the output of said multiplier circuit, and a second amplifier circuit coupled to an output of said second low-pass filter, an output of said second amplifier circuit being coupled to the first input of the pilot detector, the output of said second amplifier circuit also being negatively fed back via a second selective dc negative feedback path to the signal path between the output of the multiplier circuit and the input of the second low-pass filter.

11. A receiver as claimed in claim 1, characterized in that the first dc decoupling circuit comprises a first amplifier circuit having an input coupled to the output of the loop filter and an output coupled to the control input of the controlled oscillator, the output of said first amplifier circuit also being negatively fed back along with the output of the pilot detector, via a first selective dc negative feedback path, to the signal path between the output of the phase detector and the input of the loop filter.

12. A receiver as claimed in claim 11, characterized in that the first selective dc negative feedback path comprises a first integrator and a differential stage having an inverting input, a non-inverting input and an output, said inverting and non-inverting being coupled to, respectively, said outputs of the first amplifier circuit and the pilot detector, and the output of the differential stage being coupled to an input of the first integrator.

13. A receiver as claimed in claim 12, characterized in that the output of the multiplier circuit is coupled to the first input of the pilot detector via a second dc coupling circuit.

14. A receiver as claimed in claim 13, characterized in that the second dc decoupling circuit comprises a second low-pass filter having an input coupled to the output of said multiplier circuit, and a second amplifier circuit coupled to an output of said second low-pass filter, an output of said second amplifier circuit being coupled to the first input of the pilot detector, the output of said second amplifier circuit also being negatively fed back via a second selective dc negative feedback path to the signal path between the output of the multiplier circuit and the input of the second low-pass filter.

15. A receiver as claimed in claim 11, characterized in that the output of the multiplier circuit is coupled to the first input of the pilot detector via a second dc coupling circuit.

16. A receiver as claimed in claim 15, characterized in that the second dc decoupling circuit comprises a second low-pass filter having an input coupled to the output of said multiplier circuit, and a second amplifier circuit coupled to an output of said second low-pass filter, an output of said second amplifier circuit being coupled to the first input of the pilot detector, the output of said second amplifier circuit also being negatively fed back via a second selective dc negative feedback path to the signal path between the output of the multiplier circuit and the input of the second low-pass filter.

17. A receiver as claimed in claim 1, characterized in that the output of the multiplier circuit is coupled to the first input of the pilot detector via a second dc decoupling circuit.

18. A receiver as claimed in claim 17, characterized in that the second dc decoupling circuit comprises a second low-pass filter having an input coupled to the output of said multiplier circuit, and a second amplifier circuit coupled to an output of said second low-pass filter, an output of said second amplifier circuit being coupled to the first input of the pilot detector, the output of said second amplifier circuit also being negatively fed back via a second selective dc negative feedback path to the signal path between the output of the multiplier circuit and the input of the second low-pass filter.

19. A receiver as claimed in claim 1, characterized in that said receiver further comprises a stereo decoding circuit for decoding a baseband stereo multiplex signal, said baseband stereo multiplex signal including a baseband stereo sum signal of left and right stereo signals, a 19 kHz stereo pilot, and a stereo difference signal of said left and right stereo signals, said three signals being double sideband amplitude-modulated on a suppressed 38 kHz subcarrier, said stereo decoding circuit comprising a further phase-locked loop for phase locking with the 19 kHz stereo pilot, said further phase-locked loop forming part of said signal generator.

20. A receiver as claimed in claim 19, characterized in that the auxiliary pilot has a frequency of 38 kHz and an amplitude which corresponds to a frequency sweep of the order of 10 kHz.

21. A receiver having an RF input section for supplying a reception signal to a phase locked loop, said phase locked loop comprising:

a controlled oscillator for generating a local in-phase mixing carrier and a local quadrature mixing carrier;

a signal generator coupled to said controlled oscillator for phase modulating said mixing carriers with a local auxiliary pilot signal;

a phase detector for comparing the phase of said reception signal with the phase of said local quadrature mixing carrier;

a dynamic control loop for controlling said controlled oscillator with an ac signal provided by said phase detector, said dynamic control loop comprising a dc decoupling circuit arranged between said phase detector and said controlled oscillator;

a multiplier circuit for multiplying said reception signal with said local in-phase mixing carrier; and a static control loop comprising a pilot detector for controlling said controlled oscillator with a dc signal provided by said pilot detector in response to the local auxiliary pilot signal at an output of said multiplier circuit, said pilot detector having a first input coupled to said output and a second input coupled to said signal generator for synchronous detection of said local auxiliary pilot signal.

22. A receiver as claimed in claim 21, comprising a phase shifting circuit arranged between said signal generator and the second input of said pilot detector.

23. A receiver as claimed in claim 21, comprising a phase shifting circuit arranged between said multiplier circuit and the first input of said pilot detector.

24. A receiver as claimed in claim 21, wherein said dc decoupling circuit comprises:

an amplifier for amplifying said ac signal provided by said phase detector;

a differential stage having a first input coupled to an output of said amplifier and an output for providing a difference signal indicative of the difference between a dc voltage at an output of said amplifier and a reference dc voltage applied to a second input of said differential stage;

a dc selective negative feedback path having an input coupled to the output of said differential stage and having an output for providing a dc compensation signal derived from said difference signal; and an offsetting stage arranged between an output of said phase detector and an input of said amplifier, said offsetting stage having an input coupled to the output of said dc selective negative feedback path, for offsetting the phase detector output signal, such that the dc output voltage of said amplifier is substantially equal to said dc reference voltage.

25. A receiver as claimed in claim 24, wherein said dc signal provided by said pilot detector is supplied as said dc reference voltage to the second input of said differential stage.

26. A receiver as claimed in claim 24, wherein said dc selective negative feedback path comprises an integrator.

27. A receiver as claimed in claim 21, further comprising a stereo decoding circuit having a phase locked loop for phase locking with a stereo pilot signal, and wherein said phase locked loop forms part of said signal generator.

* * * * *